United States Patent
Young

(10) Patent No.: US 7,759,974 B1
(45) Date of Patent: Jul. 20, 2010

(54) PIPELINED UNIDIRECTIONAL PROGRAMMABLE INTERCONNECT IN AN INTEGRATED CIRCUIT

(75) Inventor: Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/174,905

(22) Filed: Jul. 17, 2008

(51) Int. Cl.
*H01L 25/00* (2006.01)
*H03K 19/177* (2006.01)

(52) U.S. Cl. ............................. 326/41; 326/38; 326/40

(58) Field of Classification Search ............. 326/38–41, 326/47
See application file for complete search history.

(56) References Cited

U.S. PATENT DOCUMENTS

| | | | |
|---|---|---|---|
| 5,208,491 | A | 5/1993 | Ebeling et al. |
| 5,367,209 | A | 11/1994 | Hauck et al. |
| 6,486,709 | B2 | 11/2002 | Sutherland et al. |
| 6,522,170 | B1 | 2/2003 | Durham et al. |
| 6,590,424 | B2 | 7/2003 | Singh et al. |
| 6,958,627 | B2 | 10/2005 | Singh et al. |
| 7,154,299 | B2 * | 12/2006 | Swami et al. .................. 326/41 |
| 7,157,934 | B2 | 1/2007 | Teifel et al. |
| 7,504,851 | B2 | 3/2009 | Manohar et al. |
| 7,505,304 | B2 | 3/2009 | Manohar et al. |
| 2005/0077918 | A1 | 4/2005 | Teifel et al. |
| 2007/0241782 | A1 * | 10/2007 | Teig et al. ...................... 326/41 |
| 2007/0253240 | A1 | 11/2007 | Manohar et al. |
| 2007/0256038 | A1 | 11/2007 | Manohar |
| 2007/0257702 | A1 * | 11/2007 | Hutchings et al. ............. 326/38 |
| 2007/0262786 | A1 | 11/2007 | Manohar et al. |
| 2008/0168407 | A1 | 7/2008 | Manohar |

OTHER PUBLICATIONS

U.S. Appl. No. 12/417,007, filed Apr. 2, 2009, Young et al.
U.S. Appl. No. 12/417,010, filed Apr. 2, 2009, Young.
U.S. Appl. No. 12/417,012, filed Apr. 2, 2009, Young.
U.S. Appl. No. 12/417,013, filed Apr. 2, 2009, Young et al.
U.S. Appl. No. 12/417,015, filed Apr. 2, 2009, Young.
U.S. Appl. No. 12/417,018, filed Apr. 2, 2009, Young et al.
U.S. Appl. No. 12/417,020, filed Apr. 2, 2009, Gaide et al.
U.S. Appl. No. 12/417,023, filed Apr. 2, 2009, Gaide et al.
U.S. Appl. No. 12/417,024, filed Apr. 2, 2009, Gaide et al.
U.S. Appl. No. 12/417,033, filed Apr. 2, 2009, Gaide et al.
U.S. Appl. No. 12/417,036, filed Apr. 2, 2009, Gaide et al.

(Continued)

*Primary Examiner*—Anh Q Tran
(74) *Attorney, Agent, or Firm*—Lois D. Cartier

(57) ABSTRACT

Integrated circuits (ICs) having pipelined unidirectional programmable interconnect structures are provided. Substantially similar logic blocks in an IC each include at least one storage element driving an output of the logic block. The IC also includes programmable routing structures, each of which includes at least one storage element unidirectionally driving an output of the routing structure without traversing any pass gates. Each routing structure has at least one unidirectional output that drives another of the routing structures or one of the logic blocks. Each logic block has at least one output that drives an input of a programmable routing structure. The logic blocks and the programmable routing structures may be interconnected by unidirectional data lines organized as multi-bit busses coupled to multi-bit ports of the logic blocks and routing structures. Each routing structure may include a handshake circuit coupled to control all bits in one of the multi-bit busses.

19 Claims, 13 Drawing Sheets

OTHER PUBLICATIONS

U.S. Appl. No. 12/417,040, filed Apr. 2, 2009, Gaide et al.
U.S. Appl. No. 12/417,043, filed Apr. 2, 2009, Gaide et al.
U.S. Appl. No. 12/417,046, filed Apr. 2, 2009, Young et al.
U.S. Appl. No. 12/417,048, filed Apr. 2, 2009, Young et al.
U.S. Appl. No. 12/417,051, filed Apr. 2, 2009, Young et al.
U.S. Appl. No. 12/417,054, filed Apr. 2, 2009, Young et al.
U.S. Appl. No. 12/417,057, filed Apr. 2, 2009, Young et al.
Achronix Semiconductor Corp., *Introduction to Achronix FPGAs*, WP001 Rev. 1.6, Aug. 7, 2008, pp. 1-7, available from Achronix Semiconductor Corp., San Jose, California, USA.
Achronix Semiconductor Corp., *Speedster FPGA Family*, PB001 v3.5, copyright 2008, pp. 1-2, available from Achronix Semiconductor Corp., San Jose, California, USA.
Ye, A. et al., "Measuring and utilising the correlation between signal connectivity and signal positioning for FPGAs containing multi-bit building blocks," *IEE Proc.-Comput. Digit. Tech.*, May 2006, pp. 146-156, vol. 153, No. 3.
Ye, Andy et al., "Using Bus-Based Connections to Improve Field-Programmable Gate-Array Density for Implementing Datapath Circuits," *IEEE Transactions on Very Large Scale Integrations (VLSI) Systems*, May 2006, pp. 462-473, vol. 14, No. 5.
Borriello, G. et al.; "The Triptych FPGA Architecture"; IEEE Transactions on Very Large Scale Integration (VLSI) Systems; vol. 3, No. 4; Dec. 1990; Copyright 1995 IEEE; pp. 491-501.
Sparso, J.; "Asynchronous Circuit Design—A Tutorial"; Copyright 2006 Jens Sparso; Technical University of Denmark; pp. 1-179.
Huang, Randy; "Hardware-Assisted Fast Routing for Runtime Reconfigurable Computing"; A dissertation submitted in partial satisfaction . . . University of California, Berkeley; Fall 2004; pp. 1-43.
Teifel, John et al.; "Highly Pipelined Asynchronous FPGAs"; FPGA "04; Feb. 22-24, 2004; Copyright 2004 ACM; pp. 133-142.
Hauser, John; "The Garp Architecture"; University of California at Berkeley; ;Oct. 1997; pp. 1-56.
Payne, R.; "Asynchronous FPGA Architecture"; Copyright IEE, 1996; IEE Proceedings online No. 19960655; Dec. 13, 1996; pp. 282286.
Martin, Alain et al.; "The Design of an Asynchronous Microprocessor"; Proc. Decennial Caltech Conference on VLSI; Mar. 20-22, 1989; pp. 1-23.
Hauck, Scott et al.; "Montage: An FPGA for Synchronous and Asynchronous Circuits"; Field-Programmable Gate Arrays: Architecture and Tools for Rapid Prototyping; 1993; pp. 44-51.
Hauck, Scott, et al.; "An FPGA for Implementing Asynchronous Circuits"; IEEE Design and Test of Computers; vol. II, No. 3; Fall, 1994; pp. 60-69.
Hauck, Scott; "Asynchronous Design Methodologies: An Overview"; Proceedings of the IEEE; vol. 83, No. 1; Jan. 1995; pp. 69-93.
From Wikipedia, the free Encyclopedia; "C-element"; downloaded from http://en.wikipedia.org/wiki/C-element, Jul. 17, 2008; pp. 1-2.
Tsu, William et al.; "High-Speed, Hierarchical Synchronous Reconfigurable Array"; FPGA 99 Monterey CA; Copyright ACM 1999; pp. 125-134.
Xilinx, Inc.; U.S. Appl. No. 12/174,926 by Young filed Jul. 17, 2008.
Xilinx, Inc.; U.S. Appl. No. 12/174,945 by Young filed Jul. 17, 2008.
Xilinx, Inc.; U.S. Appl. No. 12/174,956 by Young filed Jul. 17, 2008.
Xilinx, Inc.; U.S. Appl. No. 12/174,972 by Young et al. filed Jul. 17, 2008.

* cited by examiner

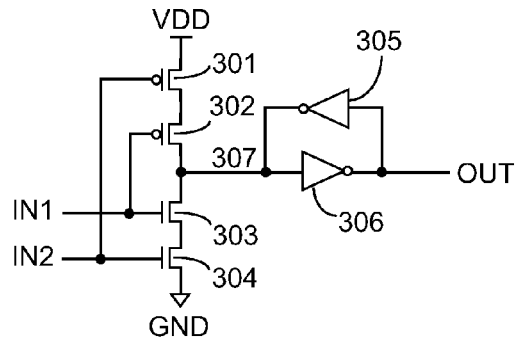
FIG. 3 (Prior Art)
| IN1 | IN2 | OUT |
|---|---|---|
| 0 | 0 | 0 |
| 0 | 1 | no change |
| 1 | 0 | no change |
| 1 | 1 | 1 |
FIG. 4 (Prior Art)
| RDY_IN | ACK_INB | RDY_OUT/ ACK_OUT |
|---|---|---|
| 0 | 0 | 0 |
| 0 | 1 | no change |
| 1 | 0 | no change |
| 1 | 1 | 1 |
FIG. 5
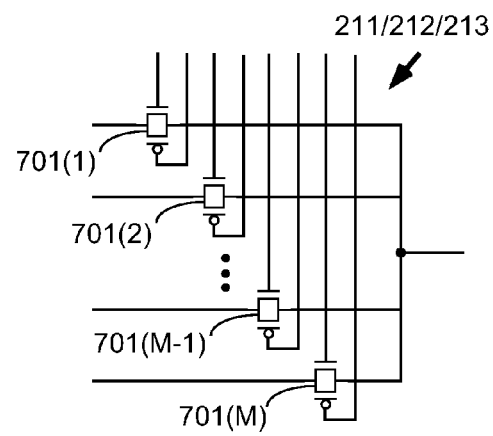
FIG. 7 (Prior Art)
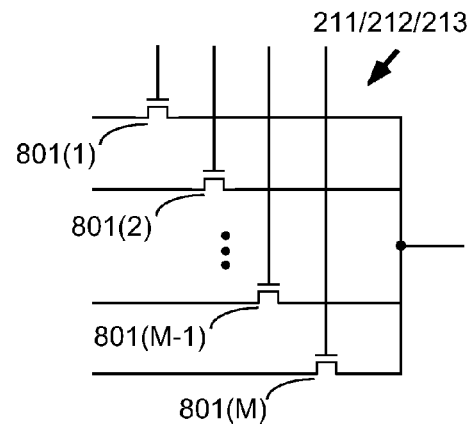
FIG. 8 (Prior Art)

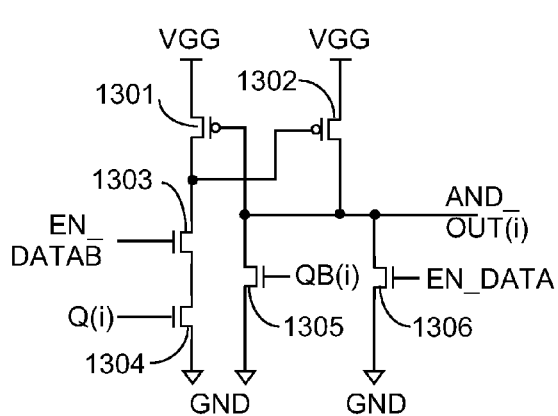
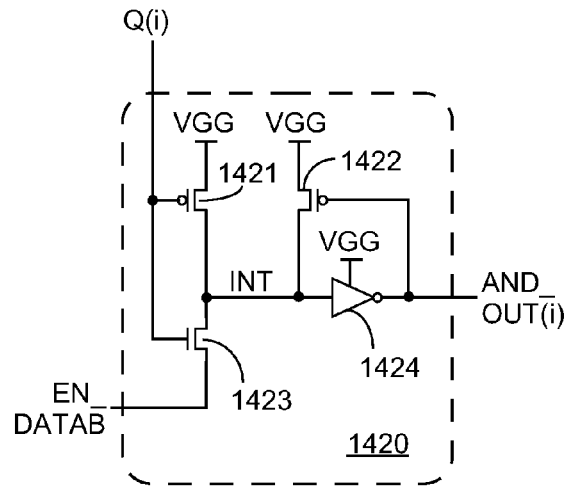
FIG. 13 (Prior Art)
FIG. 14
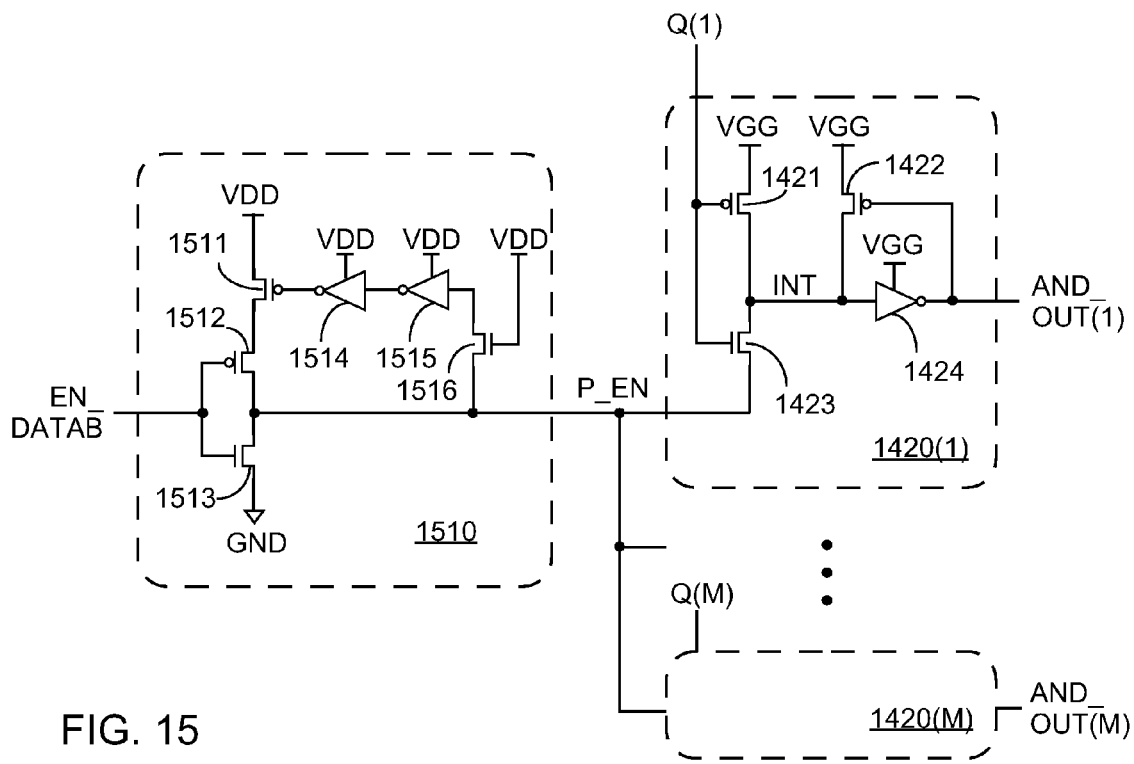
FIG. 15

PIPELINED UNIDIRECTIONAL PROGRAMMABLE INTERCONNECT IN AN INTEGRATED CIRCUIT

BACKGROUND

Programmable integrated circuits (ICs) are a well-known type of IC that can be programmed to perform specified logic functions. An exemplary type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These ICs are known as mask programmable devices. Programmable ICs can also be implemented in other ways, e.g., using fuse or antifuse technology. The terms "programmable integrated circuit" and "programmable IC" include but are not limited to these exemplary devices, as well as encompassing devices that are only partially programmable. For example, one type of programmable IC includes a combination of hard-coded transistor logic and a programmable switch fabric that programmably interconnects the hard-coded transistor logic.

Traditionally, programmable ICs include one or more extensive dedicated clock networks, as well as clock management blocks that provide clock signals for distribution to all portions of the IC via the dedicated clock networks. These clock management blocks can be quite complicated, encompassing, for example, digital locked loops (DLLs), phase locked loops (PLLs), digital clock managers (DCMs), and so forth. For example, the Virtex®-4 series of FPGAs from Xilinx, Inc. includes up to 20 DCMs, each providing individual clock deskewing, frequency synthesis, phase shifting, and/or dynamic reconfiguration for a portion of the IC. Thus, a significant amount of design and testing time is required to provide these features in the device, and their use also requires time and effort on the part of the system designer. Additionally, because a global clock signal may be needed at virtually any position in a programmable IC, a global clock network is very extensive and consumes large amounts of power when in use.

A large IC design typically includes a large number of "race conditions", where two or more signals are "racing" each other to a given destination, such as the input terminals of a logic block. Typically one of these signals is a clock signal, which must reach the destination within a certain window within which the data being provided to the destination is valid. Thus, the well-known timing requirements known as the "setup time" for data (the amount of time by which the data signal must precede the active edge of the clock signal at the input terminals of the logic block) and the "hold time" for the data (the amount of time the data signal must remain at the data input terminal after the arrival of the active edge of the clock signal) are vital to the success of a clocked design, and must be met for every clocked element, or the logic cannot be expected to operate properly.

One of the biggest challenges in providing clock services for a large programmable IC is the problem of skew. Clock and data signals distributed over a large area are naturally delayed by varying amounts, depending upon their origins and destinations as well as the nature of the network paths through which they are distributed. Therefore, clock signals are often skewed one from another, and from the related data signals. Yet, the setup and hold time requirements must be met in every instance to guarantee reliable operation of a user design implemented in the programmable IC. Therefore, it is clear that the design of reliable clock networks for a programmable IC containing potentially a hundred thousand flip-flops or other clock elements may consume a large amount of engineering resources and may adversely impact the design cycle of the programmable IC.

SUMMARY

The invention provides integrated circuits (ICs) having pipelined unidirectional programmable interconnect structures. Substantially similar logic blocks in the IC each include at least one storage element, e.g., a flip-flop or latch, driving an output of the logic block. The IC also includes a number of programmable routing structures, each of which includes at least one storage element driving an output of the routing structure without traversing any pass gates. Each routing structure has at least one output that drives another of the routing structures or one of the logic blocks. Each logic block has at least one output that drives an input of a programmable routing structure.

In some embodiments, the logic blocks and the programmable routing structures are interconnected by data lines organized as multi-bit busses coupled to multi-bit ports of the logic blocks and the routing structures. In some embodiments, each programmable routing structure includes a handshake circuit, which may be coupled to control all bits in one of the multi-bit busses.

The handshake circuit may include a C-element coupled to a control input of the storage element in the routing structure.

For example, the storage elements in the routing structure may be latches having enable inputs driven by a logic gate, e.g., a logical AND gate driven by the C-element and a memory cell.

BRIEF DESCRIPTION OF THE DRAWINGS

The present invention is illustrated by way of example, and not by way of limitation, in the following figures.

FIG. 3 illustrates a known C-element that can be used in handshake logic.

FIG. 4 illustrates in tabular form the functionality of the C-element of FIG. 3.

FIG. 5 illustrates in tabular form the functionality of the C-element of FIG. 2.

FIG. 7 illustrates a first known multiplexer structure using CMOS transmission gates.

FIG. 8 illustrates a second known multiplexer structure using N-channel transistors.

FIG. 13 illustrates a known circuit that can be used, for example, to implement the logical AND gates of FIG. 12.

FIG. 14 illustrates a first improved circuit that can be used, for example, to implement the logical AND gates of FIG. 12.

FIG. 15 illustrates a second improved circuit that can be used, for example, to implement the logical AND gates of FIG. 12.

DETAILED DESCRIPTION

While the specification concludes with claims defining some features of the invention that are regarded as novel, it is believed that the invention will be better understood from a consideration of the description in conjunction with the drawings. As required, detailed embodiments of the present invention are disclosed herein. However, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

For example, the present invention is applicable to a variety of integrated circuits (ICs). An appreciation of the present invention is presented by way of specific examples utilizing programmable ICs. However, the present invention is not limited by these examples, and may be applied to any applicable IC and/or circuit structure.

Figure 1:
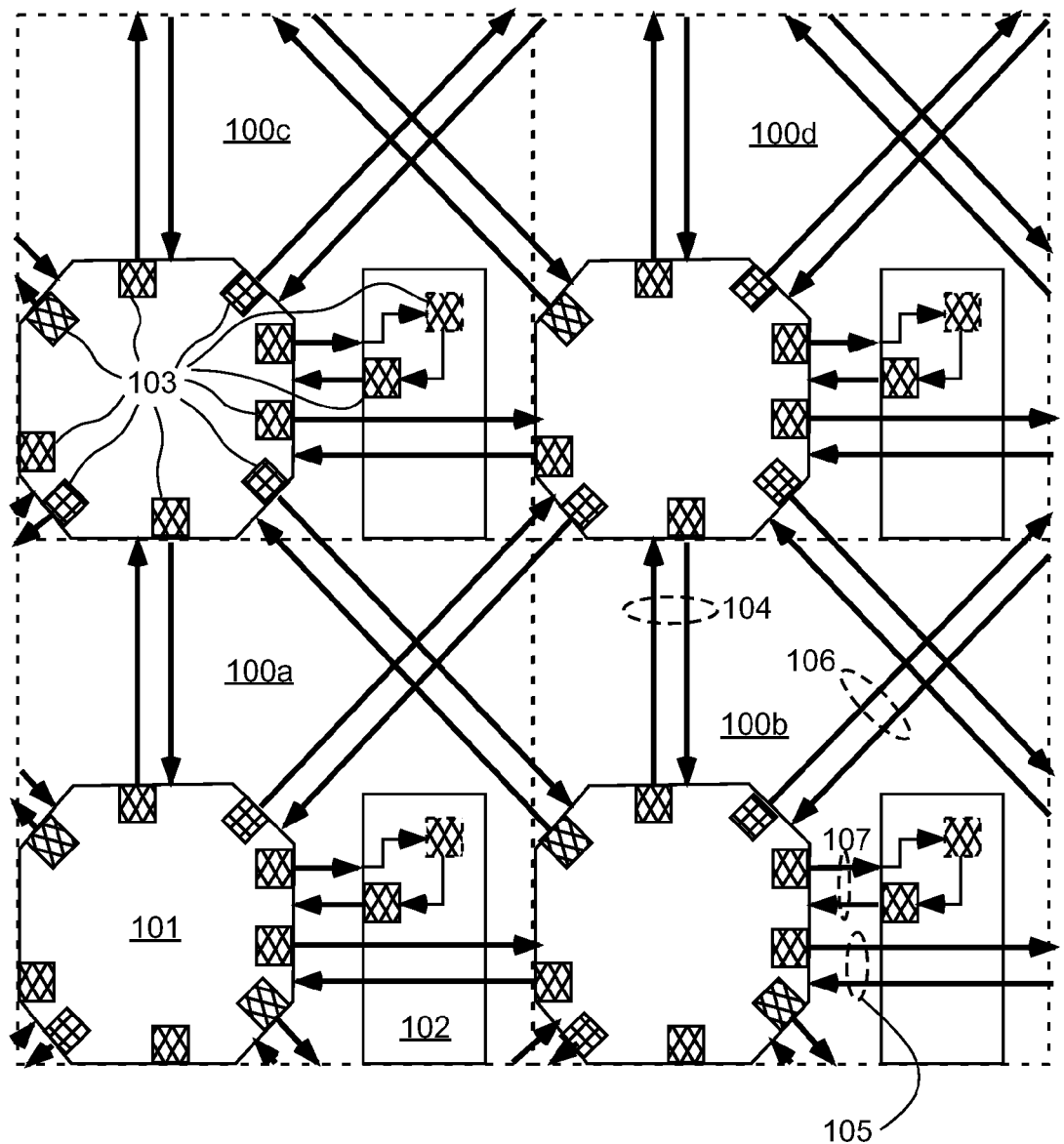
FIG. 1 is a block diagram showing an exemplary integrated circuit including an array of logic blocks interconnected by a pipelined interconnect structure.

FIG. 1 is a block diagram showing an exemplary integrated circuit including an array of substantially similar logic blocks interconnected by a pipelined interconnect structure. The interconnect structure in the illustrated embodiment includes an array of substantially similar programmable routing structures 101, with each of the routing structures 101 being coupled to an associated logic block 102 in the array of logic blocks. Looked at another way, the IC of FIG. 1 includes an array of substantially similar tiles 100a-100d, where each tile includes a programmable routing structure 101 and an associated logic block 102.

In the present specification, the term "substantially similar" is understood to mean similar to the extent that each substantially similar element performs the same functions in the same way. For example, substantially similar logic blocks include the same internal elements, e.g., lookup table, storage elements, and so forth, have the same internal connections between these elements, and are programmed in the same fashion. Similarly, substantially similar programmable routing structures couple together interconnect lines having the same logical relationships, are programmed in the same fashion, and so forth. Substantially similar elements may have a single layout, stepped and repeated, but this is not always the case. The addition of relatively small amounts of extra logic (e.g., buffers, capacitors, etc.) to one or more logic blocks and/or programmable routing structures do not prevent the logic blocks, tiles, and/or programmable routing structures from being substantially similar, nor do changes in layout, transistor sizes, and so forth.

In the illustrated embodiment, each logic block 102 includes at least one storage element 103 (e.g., flip-flop and/or latch). Such logic blocks are well known, e.g., in the Virtex™ field programmable gate arrays (FPGAs) from Xilinx, Inc. Typically, one storage element is coupled to drive an output of the logic block, e.g., directly or through an output multiplexer and/or buffer. Other storage elements may be included in the logic block as well, to provide additional pipelining functions. In the embodiment of FIG. 1, each logic block includes two storage elements, with one being positioned at the output of the logic block. In some embodiments (not shown), each logic block includes more than one output driven by a storage element. The output of each logic block may be a single bit, or a multi-bit bus.

Each logic block 102 is coupled to an associated programmable routing structure 101. The routing structure 101 is also pipelined, including a storage element 103 at each output. Thus, the routing structures and logic blocks can work together to create a fully pipelined design. Such pipelining may overcome a limitation of known programmable IC architectures, in which long interconnect lines sometimes limit the speed of operation for a circuit implemented in the IC. By pipelining the routing structures, the throughput of the overall design may be increased. In some embodiments (not shown), one or more additional outputs of routing structure 101 are not pipelined, i.e., not driven by storage elements.

FIG. 1 illustrates an IC in which the outputs of each routing structure are coupled to drive either an input of another routing structure, or an input of one of the logic blocks. The output of each logic block is coupled to drive an input of a corresponding programmable routing structure. In the pictured embodiment, each routing structure is coupled to vertical interconnect lines 104, horizontal interconnect lines 105, and diagonal interconnect lines 106. However, in some embodiments some of these options (e.g., diagonal interconnect lines 106) are not provided. Note that interconnect lines 104-106 may be single lines or multi-bit busses. For example, in one embodiment each interconnect line 104-106 is an 8-bit bus, and also includes supporting signals, as is later described. Additionally, the interconnect lines in the embodiments described herein are all unidirectional. As is later described, unidirectional interconnect lines may permit a more efficient implementation of a pipelined programmable routing structure, because the overall number of routing multiplexers can be reduced relative to a bidirectional implementation.

The interconnect lines shown in FIG. 1 are all "singles", that is, they connect a routing structure to another routing structure in an adjacent tile, either vertically adjacent (interconnect lines 104), horizontally adjacent (interconnect lines 105), or diagonally adjacent (interconnect lines 106). As is well known, interconnect lines in this type of IC architecture may include "doubles", which connect to a routing structure in a tile two tiles away, "quads", which connect to a routing structure in a tile four tiles away, and/or interconnect lines of other lengths. For clarity, interconnect lines other than singles are omitted from FIG. 1. However, some embodiments may include such interconnect lines. In some embodiments, such as those that are now described, it may be desirable not to include interconnect lines having too large a delay. One such embodiment includes singles and doubles, with no longer interconnect lines being provided.

In some embodiments, storage elements are not included for every interconnect line in every routing structure. For example, storage elements can be included in every tile for doubles, and only every other tile for singles. In other embodiments, every routing structure includes a storage element for each interconnect line.

Including asynchronous storage elements (e.g., latches) in the interconnect structure enables the use of asynchronous routing. In some embodiments, both the interconnect structure and the logic blocks are implemented asynchronously. Thus, the high level of design complexity caused by the problem of clock skew in a large IC is overcome. Additionally, the elimination of large global clock networks from the IC may substantially reduce the amount of power consumed by the IC when in operation.

Figure 2:
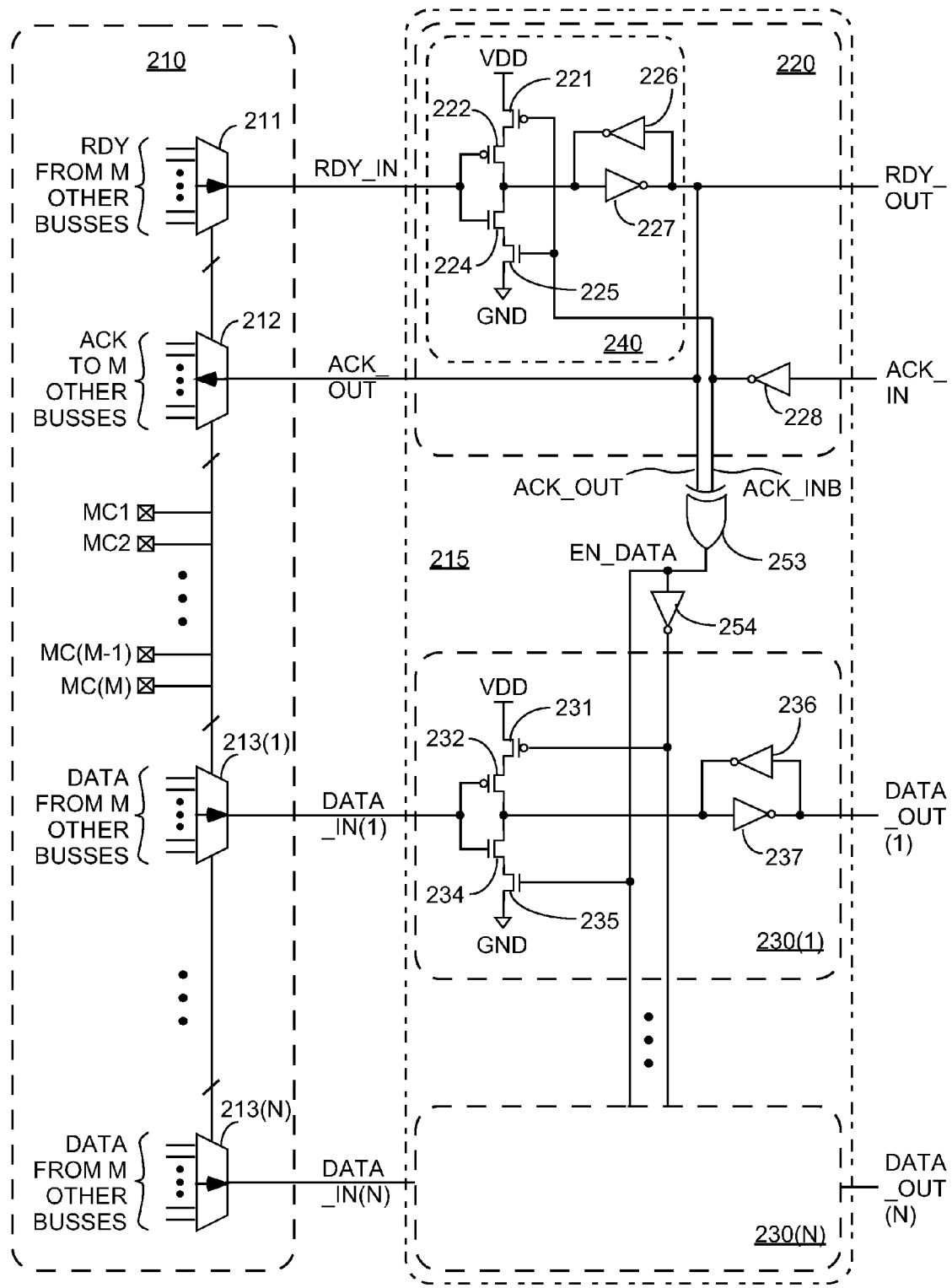
FIG. 2 illustrates a first exemplary programmable routing structure operating in a 2-phase handshake mode that can be used, for example, in the IC of FIG. 1.

FIG. 2 illustrates an exemplary programmable routing structure that can be used, for example, in the IC of FIG. 1 when the IC utilizes an asynchronous design. The embodiment of FIG. 2, as well as the other embodiments of the programmable routing structure shown in the other figures, is preferably used with an asynchronous logic block having a storage element at the output. Additional storage elements may also be optionally included in the logic block to provide further pipelining.

In FIG. 2 and the other illustrated embodiments, the interconnect structure is bus-based. In other words, the logic blocks and the programmable routing structures are interconnected by data lines organized as multi-bit busses coupled to multi-bit ports of the logic blocks and the programmable routing structures. For example, each arrow in FIG. 1 may be thought of as an N-bit bus, where N is an integer greater than one. Note, however, that while the pictured embodiments illustrate an interconnect structure based on multi-bit busses, this need not be the case. It will be clear to those of skill in the relevant arts that the illustrated embodiments may be readily adapted to apply to single-bit interconnect lines. In other words, in some embodiments, N may have a value of one.

Note also that the programmable routing structure of FIG. 2 includes the logic for a single bus, e.g., one vertical bus, one horizontal bus, or one diagonal bus in FIG. 1. Thus, each routing structure 101 of FIG. 1 includes multiple copies of the structure of FIG. 2 (e.g., nine copies as shown).

The programmable routing structure of FIG. 2 includes a programmable switching structure 210 and a bus structure 215, coupled together as shown in FIG. 2. The busses of the described embodiments include handshake logic, which is well known in the relevant arts. For example, Jens Sparso has published a tutorial on the subject of asynchronous circuit design using handshake logic, entitled "Asynchronous Circuit Design—a Tutorial", published by the Technical University of Denmark in 2006 and previously published in 2001.

Bus structure 215 includes the storage elements for the data lines and control logic for the storage elements. Thus, each data line DATA_OUT(1:N)) is latched in a corresponding storage element before leaving the routing structure. In one embodiment, N is eight, i.e., the bus is an 8-bit bus. However, N can clearly have other values less than or greater than eight. In one embodiment, N is one.

Briefly, when handshake logic is used, data is latched at appropriate intervals along the data path (e.g., when leaving each programmable routing structure or logic block, in the embodiment of FIG. 1). Each interconnect line or bus is accompanied by a ready line and an acknowledge line. A given latch on the interconnect line opens to receive a new value only when the handshake logic for the given latch acknowledges receipt of the previously received data, and the handshake logic for the subsequent latch on the interconnect line acknowledges receipt of the data previously sent by the given latch.

To implement this logical function, handshake logic typically includes a logic structure known as a C-element. FIG. 3 shows a common implementation of a C-element. Briefly, a C-element has two inputs and an output. As long as the values of the two inputs are different, the output of the C-element does not change. When both inputs go high, the output goes high. When both inputs go low, the output goes low. This behavior is shown in tabular form in FIG. 4.

The C-element implementation of FIG. 3 includes P-channel transistors 301-302, N-channel transistors 303-304, and inverters 305-306, coupled together as shown in FIG. 3. When inputs IN1 and IN2 are both high, internal node 307 is pulled low through transistors 303-304, the low value is latched by inverters 305-306, and output OUT goes high. When inputs IN1 and IN2 are both low, internal node 307 is pulled high through transistors 301-302, the high value is latched by inverters 305-306, and output OUT goes low. When inputs IN1 and IN2 have two different values, the value in the latch does not change, so output OUT does not change value.

Returning now to FIG. 2, handshake circuit 220 includes a C-element 240 (including transistors 221-222, 224-225 and inverters 226-227, coupled together as shown in FIG. 2) having a ready input RDY_IN, an acknowledge input ACK_INB, and an output RDY_OUT/ACK_OUT. (In the present specification, the same reference characters are used to refer to input and/or output terminals, input and/or output ports, signal lines, and their corresponding signals.) Note that the acknowledge and ready outputs are the same for C-element 240. Since the acknowledge output enables the latches and the ready output signals that new data is ready to send, the data latches need to be faster than the ready latch (the latch in the C-element). The behavior of C-element 240 is shown in tabular form in FIG. 5.

Handshake circuit 220 also includes an inverter 228. Inverter 228, in conjunction with XOR gate 253 and inverter 254, acts to enable (open) the data latches when handshake logic 220 signals readiness to receive new data (via signal ACK_OUT) and a handshake circuit in a subsequent circuit on the interconnect line signals receipt of the previously sent data (via signal ACK_IN).

In the pictured embodiment, each data latch 230(1:N) includes a tristate inverter (P-channel transistors 231-232 and N-channel transistors 234-235, coupled in series between power high VDD and ground GND) driving a latch (inverters 236-237). It will be clear to those of skill in the art that other latch implementations can also be used. The latch is opened (e.g., the tristate inverter is enabled) when signal EN_DATA is high.

One advantage of the data latch implementation shown in FIG. 2 is that the structure of the data latch is similar to that of the C-element. Transistors 221, 222, 224, and 225 of the C-element are similar to transistors 231, 232, 234, and 235 of the data latch, and inverters 226-227 of the C-element are similar to inverters 236-237 of the data latch. Thus, the transistors in the two structures may be given the same size, and may be laid out in the same orientations and in the same positions relative to the other transistors in the same structure. As a consequence, a data input to each data latch may be affected by the transistors in the data latch in the same or a similar manner to that in which a ready input to the C-element is affected by the transistors in the C-element.

Note that the latches in this figure and the other figures herein can also include reset and/or set circuitry such as is well known in the art. For example, each latch can include a NOR or NAND gate in the loop instead of one of the inverters, with the NOR or NAND gate driven by a reset or set input. In one embodiment of C-element 240, for example, inverter 226 is replaced by a NOR gate having a reset signal as the second input.

Figure 6:
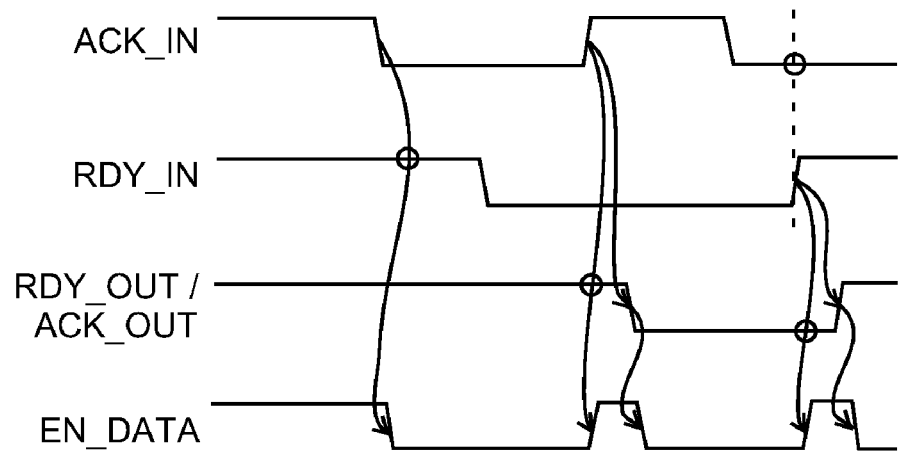
FIG. 6 is a waveform diagram illustrating the functionality of 2-phase handshake logic such as that shown in FIG. 2.

The handshake logic in bus structure 215 operates in a "2-phase mode", which is illustrated in FIG. 6. In a 2-phase handshake mode, both rising and falling edges of the triggering input signal (either the acknowledge signal from the subsequent handshake circuit (ACK_IN) or the ready signal from the instant handshake circuit (RDY_IN)) are used to enable the transfer of new data to the data latches. The ACK_IN and RDY_IN signals can change value in either order, or simultaneously. However, in all of these situations, in 2-phase mode both rising and falling edges of the triggering input signal enable a transfer of new data to the latches Because of the handshake functionality in the routing structure, each data line and each bus in the routing structure has only one source and one destination. The source and destination are selected by way of programmable switching structures. Programmable switching structure 210 performs the function of the routing multiplexers in known programmable logic devices (PLDs), for example, programmably selecting one of multiple busses and routing the selected bus onward. Programmable switching structure 210 includes N multiplexers 213(1:N) for routing the data lines, a multiplexer 211 for routing a ready signal for the N-bit bus, and a demultiplexer 212 for routing an acknowledge signal for the N-bit bus. (The term "demultiplexer" is used herein to denote a multiplexer in which the data is routed from a single input signal to one of many output signals, rather than the reverse as in an equivalent multiplexer.)

Multiplexers 211 and 213(1:N) and demultiplexer 212 can be implemented, for example, as shown in FIG. 7 or FIG. 8. The embodiment of FIG. 7 comprises CMOS transmission gates 710(1:M), with each transmission gate being controlled by a separate select input signal for the multiplexer/demultiplexer. Thus, only one of these select inputs can be high at any given time. For example, each select input may be controlled by a corresponding memory cell MC(1:M), where M is the number of data inputs/outputs (i.e., M is greater than one). Similarly, in the embodiment of FIG. 8, only one of the N-channel pass gates 801(1:M) can be turned on at any given time. In these embodiments, each select input may be controlled by a separate memory cell. For example, memory cells MC(1:M) may also be included in the programmable switching structure, as shown in FIG. 2. In some embodiments, when the switching structure is included in a programmable logic device (PLD), these memory cells may be configuration memory cells for the PLD. In some embodiments, decoders may be used to drive the select inputs to reduce the number of memory cells required to store the select data. In some embodiments, multi-stage multiplexers may be used. In some embodiments, M is ten. In some embodiments, M is greater than or less than ten.

Because all of the multiplexers 211, 213(1:N) and demultiplexer 212 have the same number of inputs/output (i.e., M), they may all be laid out in the same way. In some embodiments, the transistors in multiplexers 211, 213(1:N) and demultiplexer 212 are all the same size as those in the counterpart structures (e.g., the N-channel transistors are all a first size, and the P-channel transistors are all a second size), and the transistors have the same orientations and placements relative to the other transistors in the same structure. This layout consistency lends itself to a space-efficient implementation, although the demultiplexer will have a relatively poor performance in this embodiment because of the high fanout on the ACK_OUT signal. However, the speed of the overall circuit is generally not determined by the delay on the acknowledge path in the interconnect structure, but by delays in the logic blocks interconnected by the interconnect structure. Therefore, this additional delay on the acknowledge path generally does not impact the overall speed of operation.

In all of the embodiments illustrated herein, the interconnect lines are unidirectional. Traditionally, unidirectional interconnect lines may be regarded as being less desirable than bidirectional interconnect lines, because of their reduced flexibility. For example, the asynchronous FPGA architecture described by John Teifel and Rajit Manohar in their paper entitled "Highly Pipelined Asynchronous FPGAs," FPGA '04 Feb. 22-24, 2004, uses bidirectional interconnect lines. However, the implementation of bidirectional interconnect lines requires a larger number of multiplexers in the programmable routing structure, to implement the change of direction for the interconnect lines. When the data multiplexers reach a certain size (e.g., M reaches a certain value in the figures herein), it is preferable to increase the number of C-elements in the structure (e.g., by providing two unidirectional interconnect lines instead of one bidirectional interconnect line) rather than increasing the number of multiplexers, as C-elements consume less area than sufficiently large multiplexers.

However, some embodiments of the invention may be adapted for use with bidirectional interconnect lines.

The unidirectionality of the illustrated embodiments may also increase the speed of operation for the circuit, because a reduced number of multiplexers reduces the loading on the interconnect lines. Further, the interconnect lines can be driven directly from the storage element or through a simple buffer, rather than through one or more pass gates, as in Teifel and Manohar's FPGA (see FIG. 11 of the above-referenced paper). FIGS. 2, 9, 11, 12, 16, 17, and 18 of the present document illustrate exemplary embodiments of an asynchronous programmable IC in which the storage elements drive unidirectional interconnect lines without traversing a pass gate.

Figure 9:
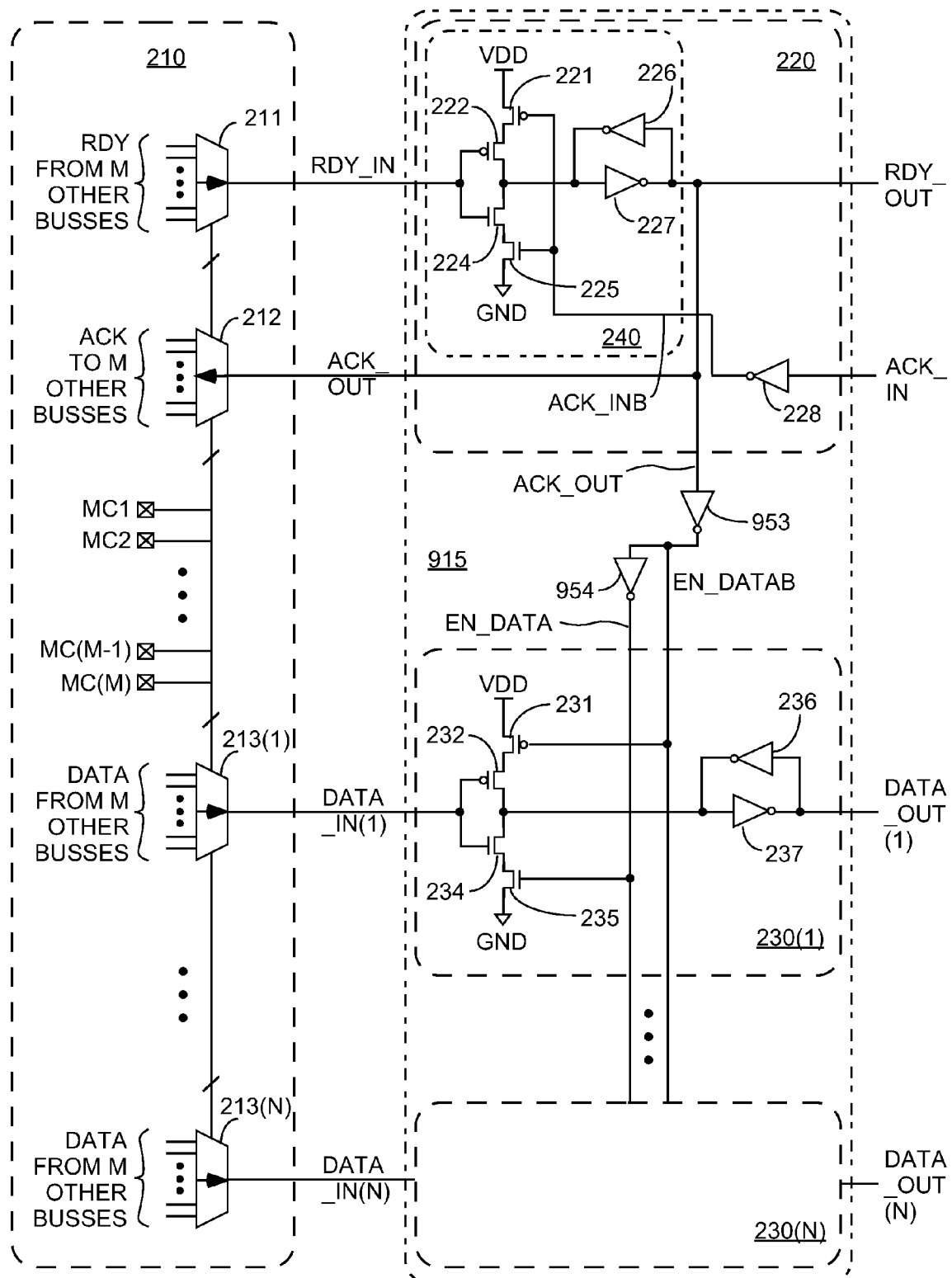
FIG. 9 illustrates how the exemplary routing structure of FIG. 2 can be modified to operate in a 4-phase handshake mode that can be used, for example, in the IC of FIG. 1.

FIG. 9 illustrates how the exemplary routing structure of FIG. 2 can be modified to operate in a 4-phase handshake mode that can be used, for example, in the IC of FIG. 1. For ease of illustration, the same numerical labels are used in FIG. 9 as in FIG. 2 to refer to the same items. However, in alternative embodiments the items may be different. To change the handshake logic of FIG. 2 from a 2-phase mode to a 4-phase mode, XOR gate 253 and inverter 254 are removed and replaced with inverters 953-954.

Figure 10:
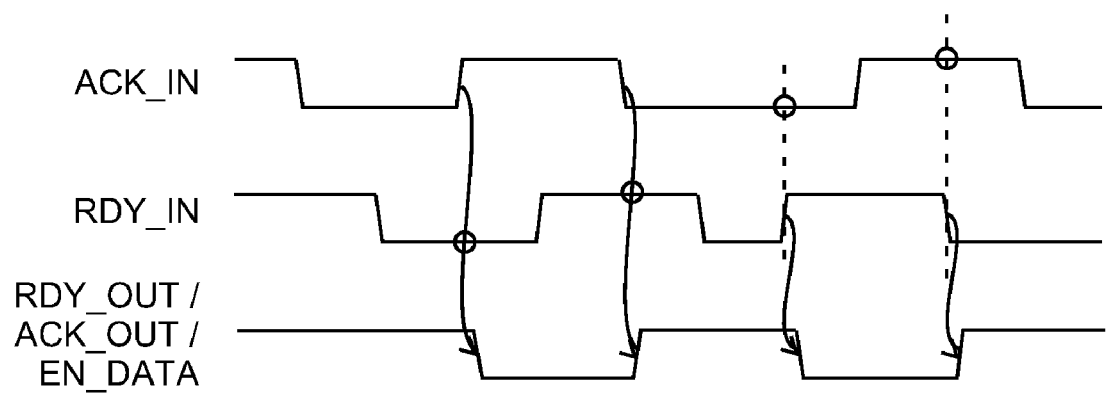
FIG. 10 is a waveform diagram illustrating the functionality of 4-phase handshake logic such as that shown in FIG. 9.

As mentioned, the handshake logic in bus structure 915 of FIG. 9 operates in a "4-phase mode", which is illustrated in FIG. 10. In a 4-phase handshake mode, only one edge of the triggering signal (either the acknowledge signal from the subsequent handshake circuit (ACK_IN) or the ready signal from the instant handshake circuit (RDY_IN)) is used to enable the transfer of new data to the data latches. In the pictured embodiment, the falling edge of the triggering signal is used to enable the transfer of new data into the latches. However, it will be clear to those of skill in the art that the circuitry in the 4-phase embodiments shown herein could be adapted to use the rising edge of the triggering signal for this purpose. The ACK_IN and RDY_IN signals can actually change value in either order, or simultaneously. However, in all of these situations, in 4-phase mode only the rising or the falling edge of the triggering input signal, and not both, enables a transfer of new data to the latches.

Figure 11:
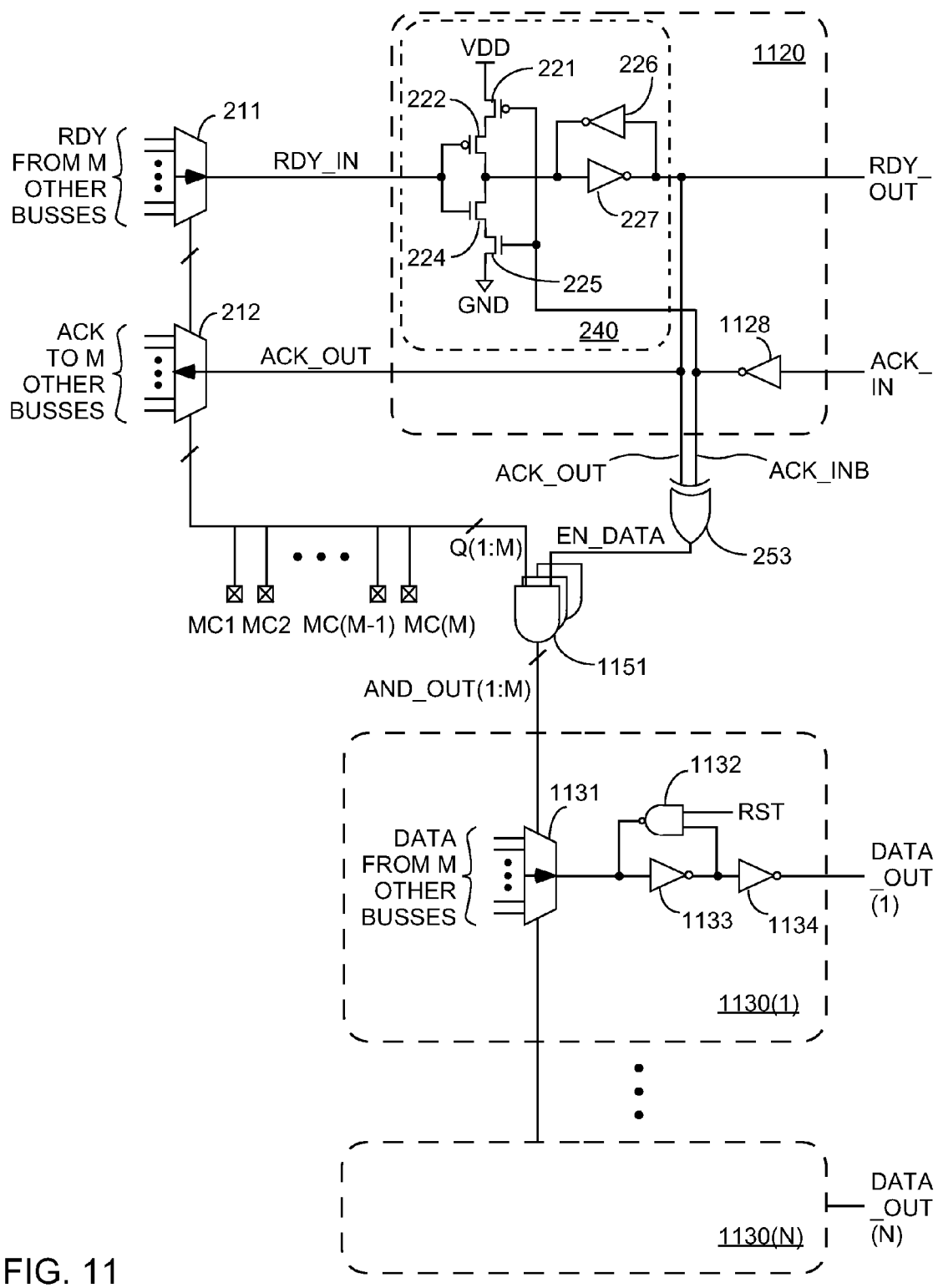
FIG. 11 illustrates a second exemplary programmable routing structure operating in a 2-phase handshake mode that can be used, for example, in the IC of FIG. 1.

FIG. 11 illustrates a second exemplary programmable routing structure operating in a 2-phase handshake mode that can be used, for example, in the IC of FIG. 1. For ease of illustration, the same numerical labels are used in FIG. 11 as in FIG. 2 to refer to the same items. However, in alternative embodiments the items may be different.

The routing structure of FIG. 11 utilizes a novel bus structure in which the data routing multiplexers are absorbed into the data storage elements. Thus, each storage element 1130 (1:N) includes a data multiplexer 1131 that selects one of M data inputs, e.g., data bits from other routing structures or logic blocks, and a latch having a data input driven by the data multiplexer. The select inputs of the data multiplexers are driven by the control inputs AND_OUT(1:M) of the storage element. Thus, the data multiplexers implement the enable function for the storage element/latch. In the pictured embodiment, the latch includes an inverter 1133 and a NAND gate 1132 having a reset input RST, and drives the data output DATA_OUT(1:N) through another inverter 1134. However, it will be clear to those of skill that the latch can be implemented using many different known methods.

Importantly, the control inputs of the storage element are driven by logic gates (M logical AND gates 1151 in the pictured embodiment) that combine values Q(1:M) from the memory cells QC(1:M) with a control signal EN_DATA from the handshake logic 1120. In the pictured embodiment, each input to the data multiplexers is controlled by a separate memory cell MC(1:M). Thus, each AND gate output AND_OUT(i) is high only when the corresponding memory cell MC(i) stores a high value and the NOR gate 253 is providing a high enable signal EN_DATA.

Multiplexer 1131 may be implemented as a single-stage multiplexer (see FIGS. 7 and 8), or as a multi-stage multiplexer. It will be clear to those of skill in the art that in the multi-stage embodiments, the logical AND gates need be applied only to the final stage of the multiplexer. In other embodiments, the logical AND gates are applied to an earlier stage, e.g. the first stage, instead of to the final stage.

Handshake circuit 1120 includes a C-element 240 (which may be similar to C-element 240, as shown, or may be another implementation) and an inverter 1128, coupled together as shown in FIG. 11. The enable signal EN_DATA is provided by XOR gate 253, driven by the ACK_OUT signal and the inverse of the ACK_IN signal, in a similar fashion to the embodiment of FIG. 2. Thus, it is clear that the handshake logic for this routing structure operates in a 2-phase mode, as described above in conjunction with FIGS. 2 and 6.

Figure 12:
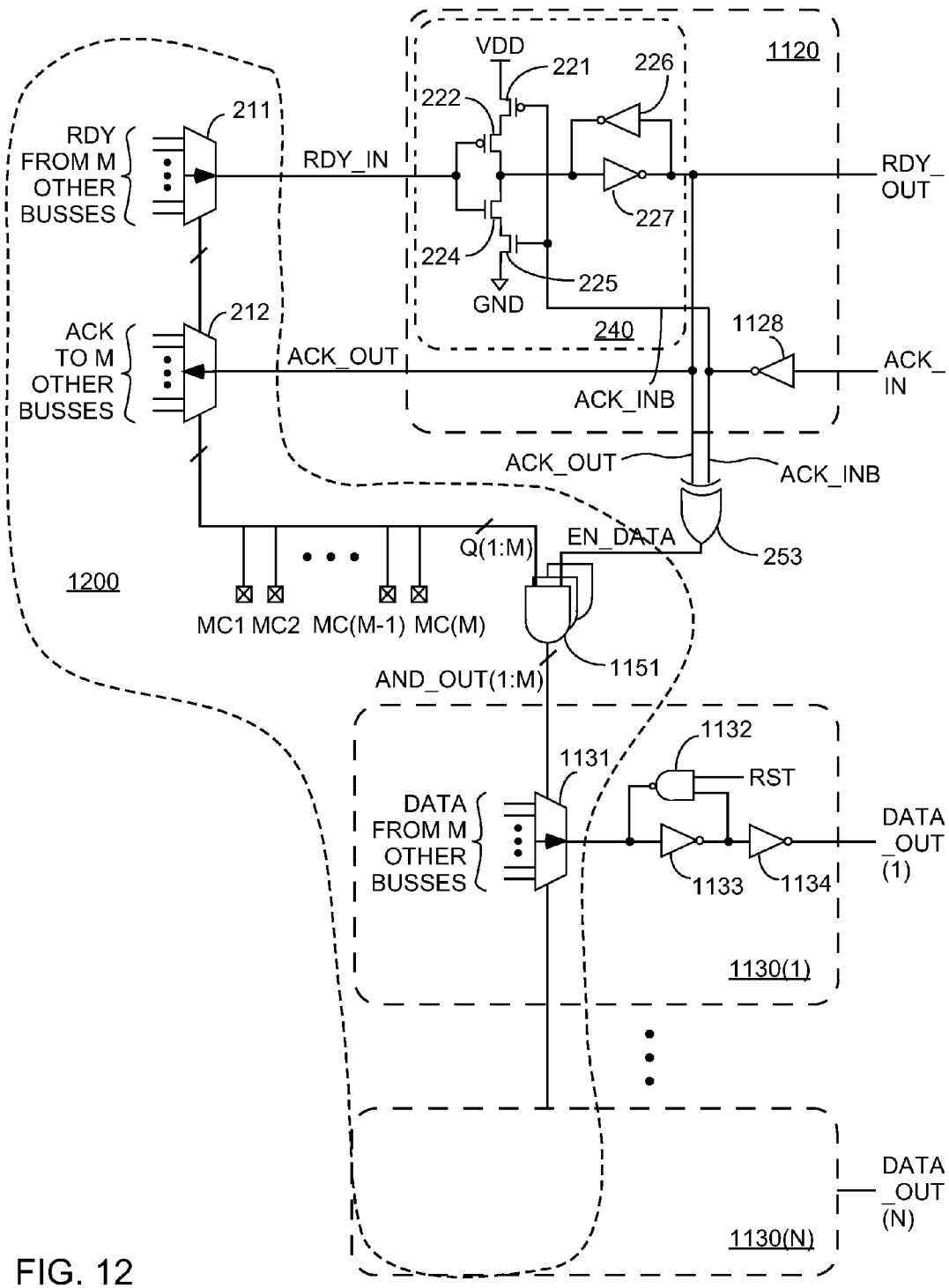
FIG. 12 illustrates how the performance of the embodiment of FIG. 11 can be improved by using multiple oxide thicknesses for the transistors.

FIG. 12 illustrates how the performance of the embodiment of FIG. 11 can be improved by using multiple power high voltages. In the embodiment of FIG. 12, the logic in the circuit portion 1200 is implemented using a higher power high voltage than the logic outside portion 1200. Thus, the circuits in portion 1200 (which include the routing multiplexers/demultiplexer, those elements most likely to slow the circuit) will operate at a faster speed than they would have at the standard power high voltage. To operate properly and without damaging the transistors, transistors in this portion of the routing structure utilize a thicker oxide than transistors outside of portion 1200. This technique may also be applied to the other embodiments illustrated herein. Note that the higher power high voltage is only applied to the gates (i.e., the select inputs) of the multiplexers/demultiplexers in portion 1200, and not to the data inputs/outputs.

Note that logical AND gates 1151 are operating at the higher power high voltage VGG, and each logical AND gate 1151 has one input at each of the two voltages, i.e., one of signals Q(1:M) at the higher voltage VGG and signal EN_DATA at the lower power high voltage VDD. Traditionally, such a logical AND gate may be implemented as shown in FIG. 13, for example.

The logical AND gate of FIG. 13 includes N-channel transistors 1303-1306 and P-channel transistors 1301-1302, coupled together as shown in FIG. 13. Note that the two input signals must be inverted, so the structure requires two additional inverters (not shown), and the circuit structure is actually driven by the four signals EN_DATA, EN_DATAB, Q(i), and QB(i). Routing these additional signals consumes additional metal tracks, and can adversely impact the layout of the circuit. Additionally, the embodiment of FIG. 13 does not drive the output strongly, so an additional inverter on the output AND_OUT(i) is desirable.

The circuit of FIG. 13 can be used in the embodiment of FIG. 12, if desired. However, FIG. 14 shows another implementation of a logical AND gate that can be used instead of the known implementation shown in FIG. 13. The implementation of FIG. 14 has the advantage that the Q(i) input signal need not be inverted, and there is no need for an additional inverter on the output. Thus, the circuit of FIG. 14 uses fewer transistors than the circuit of FIG. 13.

AND logic circuit 1420 of FIG. 14 includes P-channel transistors 1421-1422, N-channel transistor 1423, and inverter 1424, coupled together as shown in FIG. 14. When used as shown in FIG. 12, the EN_DATAB input of the AND logic circuit operates at the first (lower) power high level VDD, and the Q(i) input from the memory cell operates at the second (higher) power high level VGG. The EN_DATAB signal is the inverse of the EN_DATA signal, and may be easily generated by adding an inverter to the circuit of FIG. 12. The output of AND logic circuit 1420 operates at the second power high level VGG. (A signal is said herein to "operate at" a given voltage level when the value varies between ground GND and the given voltage level.) AND logic circuit 1420 operates as follows.

When input Q(i) is low, transistor 1423 is turned off, transistor 1421 pulls internal node INT high, driving output AND_OUT low through inverter 1424. The low value on output AND_OUT turns on transistor 1422, pulling internal node INT to the value of power high VGG. The VGG value on node INT fully turns off the P-channel transistor in inverter 1424, essentially eliminating the crowbar current through the inverter. Thus, when input Q(i) is low, output AND_OUT is also low.

When input Q(i) is high (with the value of power high VGG), transistor 1421 is off and transistor 1423 is on. Thus, AND logic circuit 1420 is essentially a half-latch driven by signal EN_DATAB through transistor 1423. A low value on input EN_DATAB is passed through transistor 1423 and inverted by inverter 1424 to provide a high value on output AND_OUT(i). A high value on input EN_DATAB is passed through transistor 1423 and inverted by inverter 1424 to provide a low value on output AND_OUT(i).

In many situations, the AND logic circuit of FIG. 14 can satisfactorily be used to implement an AND function with two different input voltage levels and an output driven at the higher of the two voltage levels. However, for some combinations of values for VDD, VGG, and Vtn (the threshold voltage of transistor 1423) there may be undesirable current flow from VGG to VDD. When input Q(i) is high and input EN_DATAB is high, there may be current flow between the two power high voltages VGG and VDD, through transistors 1422 and 1423. This current flow may be overcome by adding a pulsed driver circuit to the logical AND circuit, as shown in FIG. 15.

The circuit structure of FIG. 15 includes a pulsed driver circuit 1510 and one or more AND logic circuits 1420(1:M). Pulsed driver circuit 1510 operates at the lower power high voltage VDD, has an input EN_DATAB operating at VDD, and an output operating at VDD that provides signal P_EN to AND logic circuits 1420(1:M). In response to a falling edge on signal EN_DATAB, pulsed driver circuit 1510 drives a high value onto output P_EN, and then releases the output signal P_EN to be driven high by AND logic circuits 1420(1:M).

Pulsed driver circuit 1510 includes P-channel transistors 1511-1512, N-channel transistors 1513 and 1516, and inverters 1514-1515, coupled together as shown in FIG. 15. The circuit structure of FIG. 15 operates as follows.

When input Q(i) is low, transistor 1423 is turned off, transistor 1421 pulls internal node INT high, driving output AND_OUT low through inverter 1424. The low value on output AND_OUT turns on transistor 1422, reinforcing the high value on internal node INT. Thus, when input Q(i) is low, output AND_OUT is also low, regardless of the value of input EN_DATAB.

When input Q(i) is high (with the value of power high VGG), transistor 1421 is off and transistor 1423 is on. Thus, AND logic circuit 1420 is essentially a half-latch driven by signal P_EN through transistor 1423. A falling edge on input EN_DATAB turns on transistor 1512. Transistor 1511 is already on, because signal P_EN was low and the low value was passed to the gate of transistor 1511 through feedback path 1516-1514. Thus, signal P_EN goes high with a value of power high VDD. The high value is passed through transistor 1423 and inverted by inverter 1424 to provide a low value on output AND_OUT(i). The high value on signal P_EN also passes to the gate of transistor 1511 through the feedback path 1516-1514, and turns off transistor 1512. Therefore, pulsed driver circuit 1510 stops driving signal P_EN. However, signal P_EN remains high, because transistors 1423 and 1422 are on. However, signal P_EN is now at the VGG power high level, rather than at VDD.

When input Q(i) is high and a rising edge is received on input EN_DATAB, signal P_EN is pulled low through transistor 1513. The low value passes through transistor 1423 and is inverted by inverter 1424 to provide a high value on output AND_OUT(i).

Figure 16:
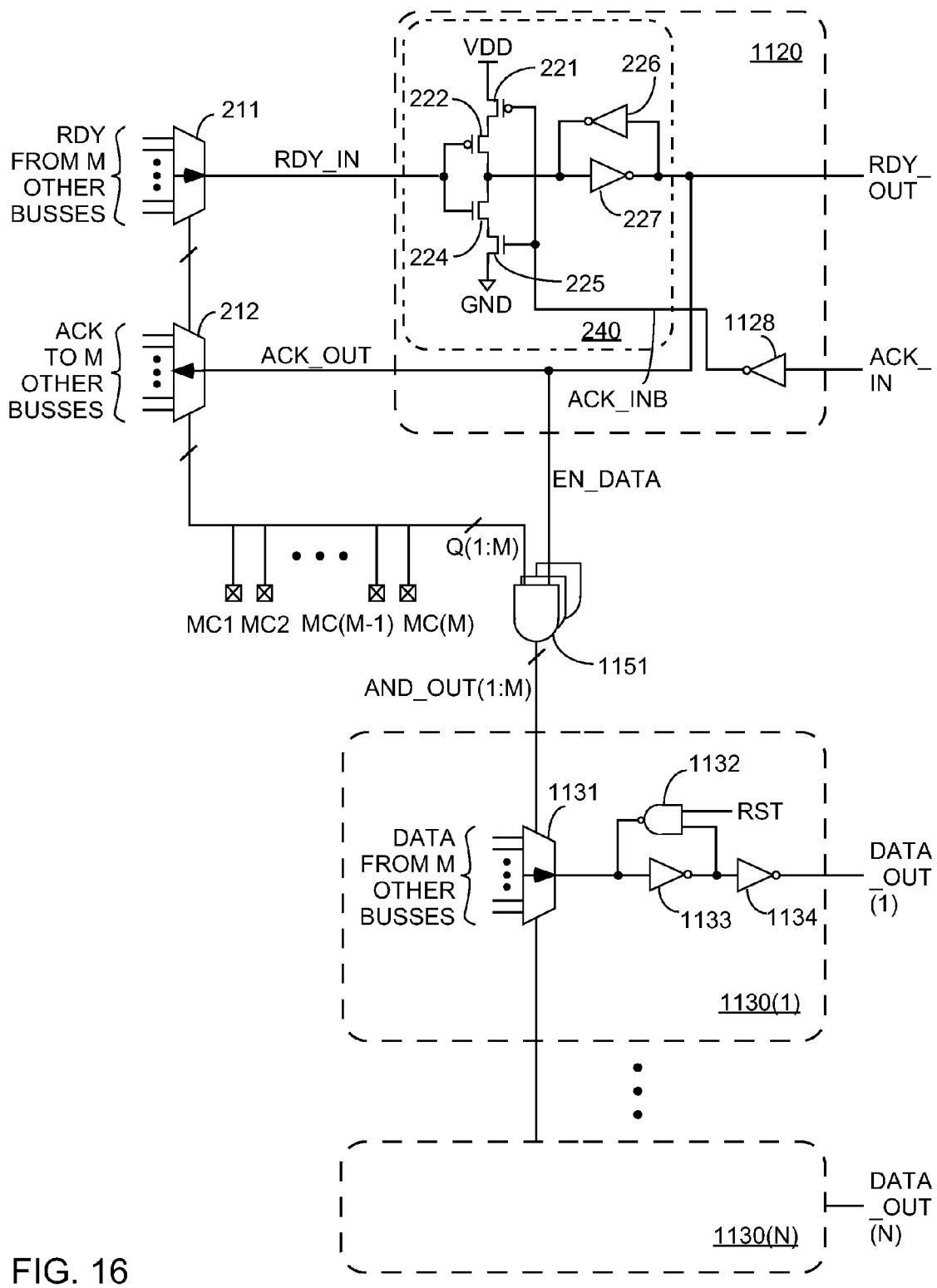
FIG. 16 illustrates how the exemplary routing structure of FIG. 11 can be modified to operate in a 4-phase handshake mode that can be used, for example, in the IC of FIG. 1.

FIG. 16 illustrates how the exemplary routing structure of FIG. 11 can be modified to operate in a 4-phase handshake mode that can be used, for example, in the IC of FIG. 1. For ease of illustration, the same numerical labels are used in FIG. 16 as in FIGS. 2 and 11 to refer to the same items. However, in alternative embodiments the items may be different. To change the handshake logic of FIG. 11 from a 2-phase mode to a 4-phase mode, XOR gate 253 is removed and the EN_DATA signal is the same as the ACK_OUT signal. Otherwise, the logic remains the same.

Figure 17:
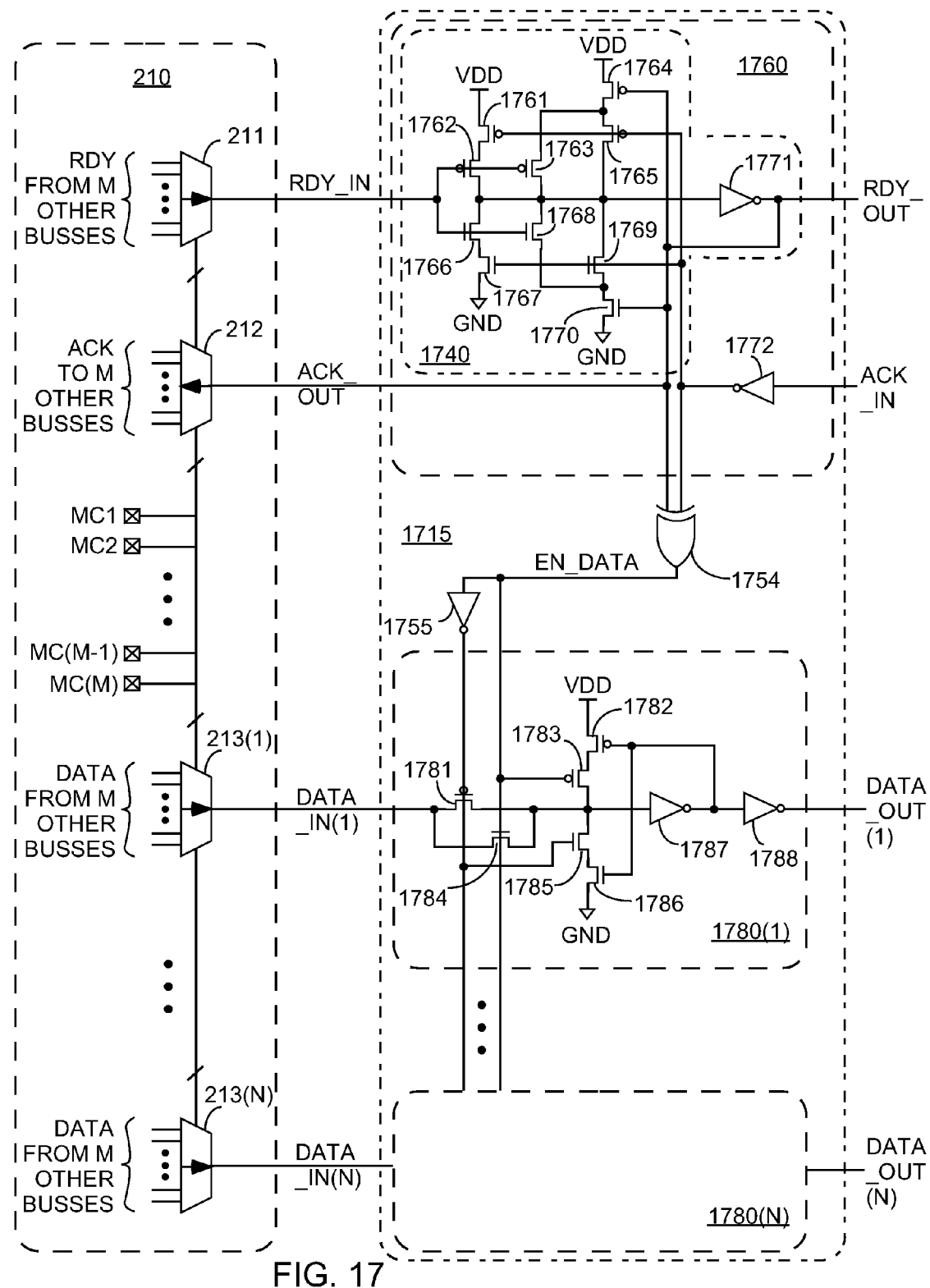
FIG. 17 illustrates a third exemplary programmable routing structure operating in a 2-phase handshake mode that can be used, for example, in the IC of FIG. 1.

FIG. 17 illustrates a third exemplary programmable routing structure operating in a 2-phase handshake mode that can be used, for example, in the IC of FIG. 1. The programmable switching structure 210 is the same as that of FIG. 2, although it can differ in some embodiments. The bus structure 1715 is similar to bus structure 215 of FIG. 2, but utilizes different implementations of the C-element and the data storage elements.

Handshake circuit 1760 includes a known C-element 1740 that includes P-channel transistors 1761-1765, N-channel transistors 1766-1770, and inverter 1771, coupled together as shown in FIG. 17. The functionality of C-element 1740 is the same as C-element 240 of FIG. 2, but in some circumstances the implementation of FIG. 17 may be preferred. In C-element 1740, the feedback inverter has been replaced by stacked devices, so the feedback inverter turns off when a new value is being written to the latch. Therefore, the sizing of the transistors is less important. Handshake circuit 1760 also includes inverter 1772, which is driven by the acknowledge line ACK_IN.

Each data storage element 1780(1:N) includes P-channel transistor 1781 and N-channel transistor 1784 coupled to form a CMOS transmission gate enabled by a high value on the EN_DATA signal from XOR gate 1754. Inverter 1755 provides the complement (active low) enable input signal from the active high enable signal EN_DATA. The CMOS transmission gate drives inverter 1787, which feeds back to control the structure formed from P-channel transistors 1782-1783 and N-channel transistors 1785-1786, coupled in series between power high VDD and ground GND. Thus, transistors 1782-1783, 1785-1786 and inverter 1787 form a latch that provides the storage function for the storage element 1780(1:N). An inverter 1788 buffers the output DATA_OUT(1:N) from the data storage element 1780(1:N).

Figure 18:
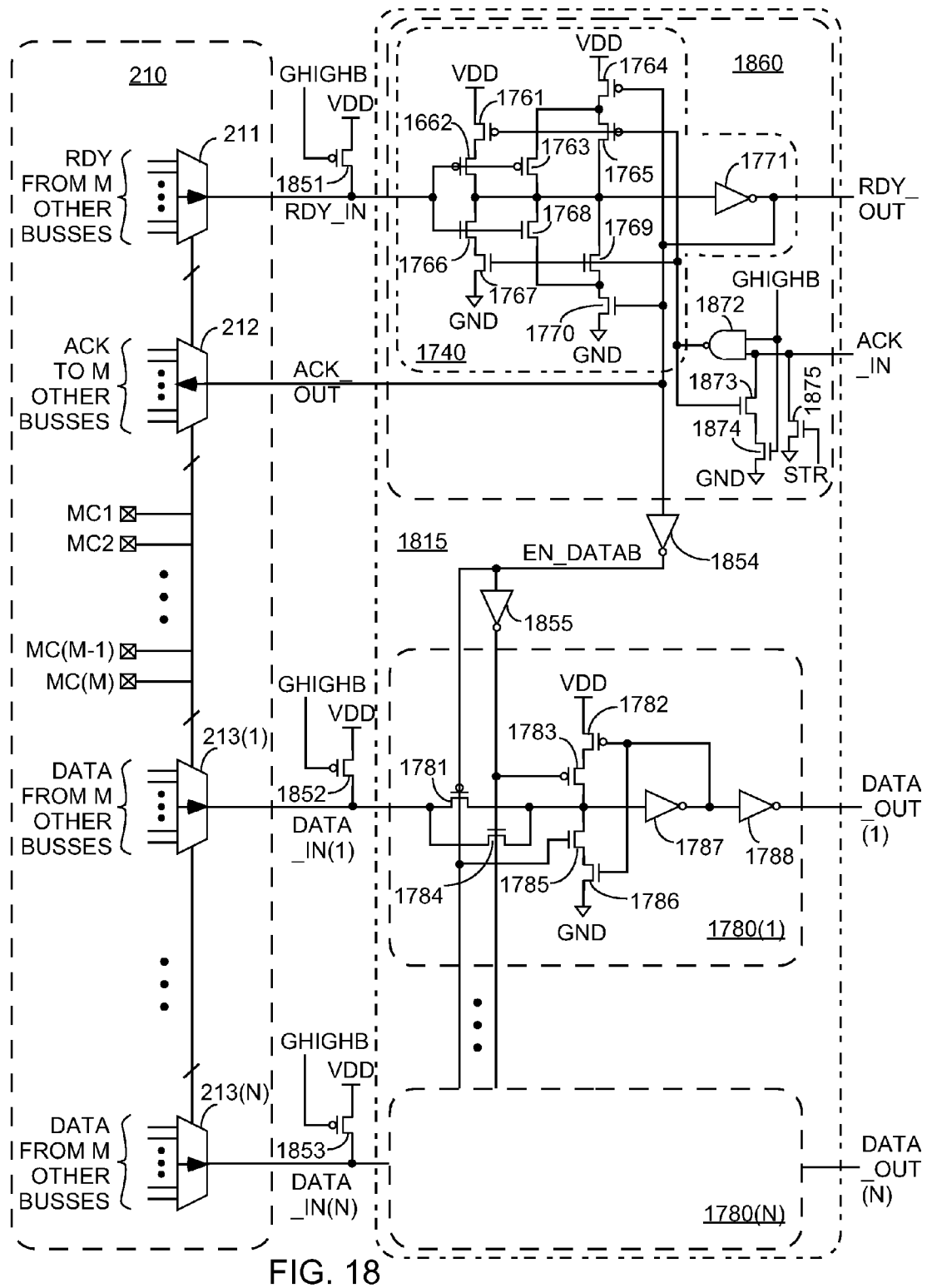
FIG. 18 illustrates how the exemplary routing structure of FIG. 17 can be modified to operate in a 4-phase handshake mode and to include initialization circuitry for the routing structure.

FIG. 18 illustrates how the exemplary routing structure of FIG. 17 can be modified to operate in a 4-phase handshake mode that can be used, for example, in the IC of FIG. 1. For ease of illustration, the same numerical labels are used in FIG. 18 as in FIG. 17 to refer to the same items. However, in alternative embodiments the items may be different. To change the handshake logic of FIG. 17 from a 2-phase mode to a 4-phase mode, XOR gate 1754 is replaced by an inverter 1854 driven by signal ACK_OUT from the C-element, and inverter 1855 replaces inverter 1755, in bus structure 1815. Thus, the enable signal EN_DATAB for the latches is active low, rather than active high as in the embodiment of FIG. 17.

FIG. 18 also includes exemplary initialization logic that can be used to place the handshake logic and data lines into known states, e.g., at power-up or during a configuration sequence for a programmable IC. Handshake circuit 1860 includes NAND gate 1872 driven by the acknowledge line ACK_IN and an input signal GHIGHB. Handshake circuit 1860 also includes N-channel transistors 1873, 1874, and 1875 coupled together as shown in FIG. 18 and driven by NAND gate 1872, input signal GHIGHB, and a strobed input signal STR, respectively. Signals GHIGHB and STR are used as part of the initialization process, which is discussed in conjunction with FIGS. 19-21.

The ready input RDY_IN to the C-element and a node DATA_IN(1:N) on each data line also have a pullup 1851-1853 to power high (VDD in the pictured embodiment; VGG in other embodiments). In the pictured embodiment, these initialization transistors are gated by an input signal GHIGHB. Input signal GHIGHB is also used as part of the initialization process, which is discussed in conjunction with FIGS. 19-21.

Figure 19:
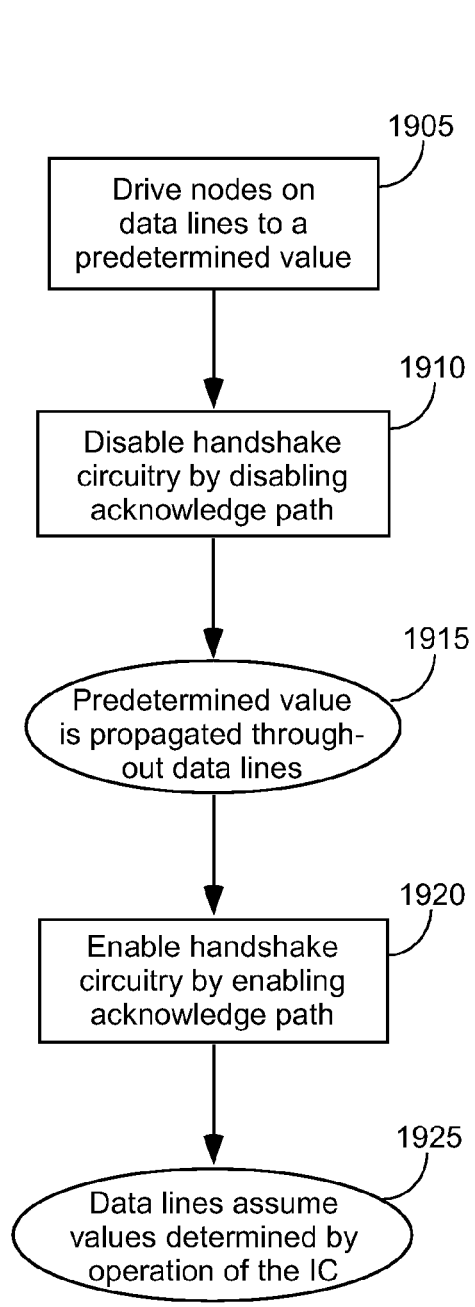
FIG. 19 is a flow diagram illustrating a method of initializing a routing structure in an IC that might or might not be programmable.
Figure 20:
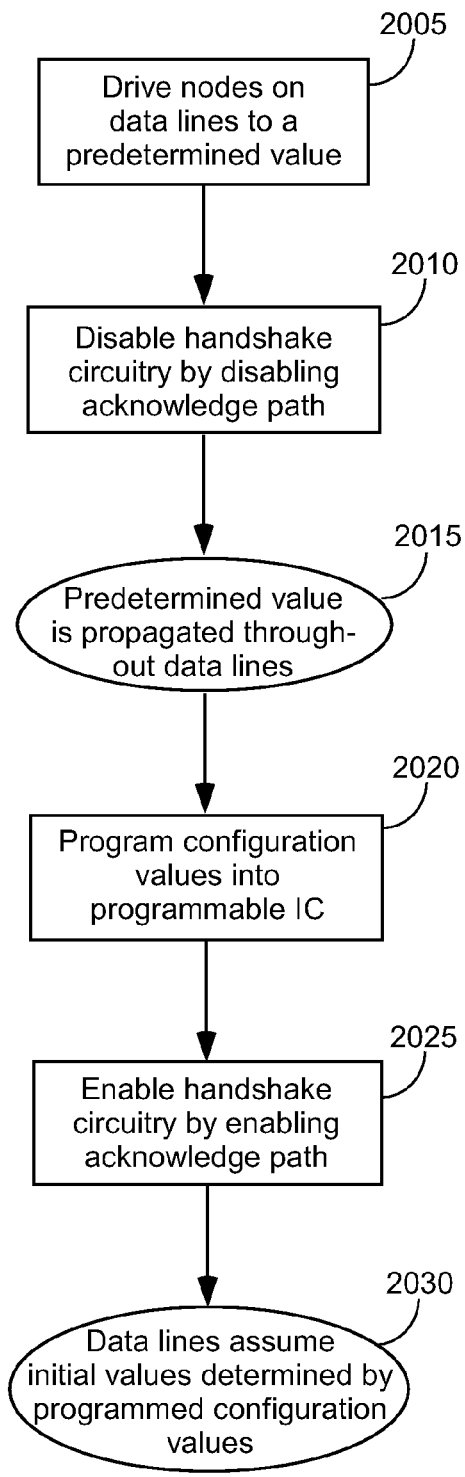
FIG. 20 is a flow diagram illustrating a method of initializing a routing structure in a programmable IC.

FIGS. 19 and 20 are flow diagrams illustrating methods of initializing routing structures in ICs, where the routing structures include data lines and handshake circuitry. The methods of FIGS. 19-20 can be applied, for example, to the circuit of FIG. 18. With the addition of appropriate initialization circuitry, the methods of FIGS. 19 and 20 can also be applied to the other exemplary routing structure embodiments illustrated herein. Those of skill in the art will have the ability to develop such circuitry after review and study of the embodiments disclosed in FIGS. 18-21 herein and in view of the following description of the initialization process.

The method illustrated in FIG. 19 can be applied to ICs that may or may not be programmable, i.e., the ICs may be non-programmable ICs, partially programmable ICs, fully programmable ICs, PLDs, FPGAs, CPLDs, and so forth.

In step 1905, a node on each of the data lines is driven to a predetermined value (e.g., a high value in the embodiment of FIG. 18). In step 1910, the handshake circuitry is disabled by disabling an acknowledge path within the handshake circuitry. In the pictured embodiments, the handshake circuitry is disabled by forcing all acknowledge signals in the acknowledge path to signal an acknowledgement of received data (e.g., all signals ACK_OUT are driven high in FIG. 18). As a result, the predetermined value is propagated throughout the data lines (action 1915).

In some embodiments, disabling the acknowledge path causes latches on the data lines to be enabled to pass the predetermined value (e.g., in FIG. 18, the high values on the DATA_IN nodes are passed through the latches to the DATA_OUT outputs).

In some embodiments, the acknowledge signals in the acknowledge path are forced to signal an acknowledgement of received data (e.g., ACK_OUT is forced high in FIG. 18) by forcing all ready signals RDY_IN within the handshake circuitry to the predetermined value (a low value on signal GHIGHB pulls signal RDY_IN high through transistor 1851 in FIG. 18) and placing associated C-elements 1740 in a state where each C-element passes the predetermined value from an associated ready signal RDY_IN to the associated acknowledge signal ACK_OUT (the low value on signal GHIGHB forces the output of NAND gate 1872 high, placing the C-element 1740 in a state where it passes a high value but not a low value).

Note that steps 1905 and 1910 may occur concurrently. In one embodiment, the driving and disabling occur in response to an initialization signal assuming a first value (e.g., GHIGHB assumes a low value in FIG. 18).

In step 1920, the handshake circuitry is enabled by enabling the acknowledge path (e.g., releasing the ACK_OUT signals in FIG. 18). As a result, the data lines are released to assume values determined by operation of the IC (action 1925). The enablement and release may occur at a point in time after the initialization signal assumes a second value, where the second value is opposite to the first value (e.g., the second value is a high value in FIG. 18).

FIG. 20 is a flow diagram illustrating a method of initializing a routing structure in a programmable IC. For example, the IC in these embodiments may be a partially programmable IC, fully programmable IC, PLD, FPGA, CPLD, and so forth.

In step 2005, a node on each of the data lines is driven to a predetermined value (e.g., a high value in the embodiment of FIG. 18). In step 2010, the handshake circuitry is disabled by disabling an acknowledge path within the handshake circuitry. As a result, the predetermined value is propagated throughout the data lines (action 2015). In the pictured embodiments, the handshake circuitry is disabled by forcing all acknowledge signals in the acknowledge path to signal an acknowledgement of received data (e.g., all signals ACK_OUT are driven high in FIG. 18).

In some embodiments, disabling the acknowledge path causes latches on the data lines to be enabled to pass the predetermined value (e.g., in FIG. 18, the high values on the DATA_IN nodes are passed through the latches to the DATA_OUT outputs).

In some embodiments, the acknowledge signals in the acknowledge path are forced to signal an acknowledgement of received data (e.g., ACK_OUT is forced high in FIG. 18) by forcing all ready signals RDY_IN within the handshake circuitry to the predetermined value and placing associated C-elements 1740 in a state where each C-element passes the predetermined value from an associated ready signal RDY_IN to an associated acknowledge signal ACK_OUT.

Note that steps 2005 and 2010 may occur concurrently (e.g., as in the embodiment of FIG. 18). In one embodiment, the driving and disabling occur in response to an initialization signal assuming a first value (e.g., GHIGHB assumes a low value in FIG. 18). In this embodiment, the method illustrated in FIG. 20 occurs in response to a configuration sequence for the programmable IC, and the nodes on the data lines are driven to the predetermined value by (for example) pullups 1852-1853 in FIG. 18. In another embodiment, the nodes on the data lines are driven to the predetermined value by forcing data outputs from the logic blocks to the predetermined value (e.g., a high value), and these values are propagated throughout the data lines by the disabling step 2010. In these embodiments, pullups 1852-1853 may be omitted.

In step 2020, configuration values are programmed into the programmable IC. In step 2025, the handshake circuitry is enabled by enabling the acknowledge path (e.g., releasing the ACK_OUT signals in FIG. 18). As a result, the data lines are released to assume initial values determined by the programmed configuration values. Clearly, the data lines may assume other values during operation of the design implemented by the configuration values. The enablement and releasing may occur at a point in time after the initialization signal assumes a second value, where the second value is opposite to the first value (e.g., the second value is a high value in FIG. 18).

Figure 21:
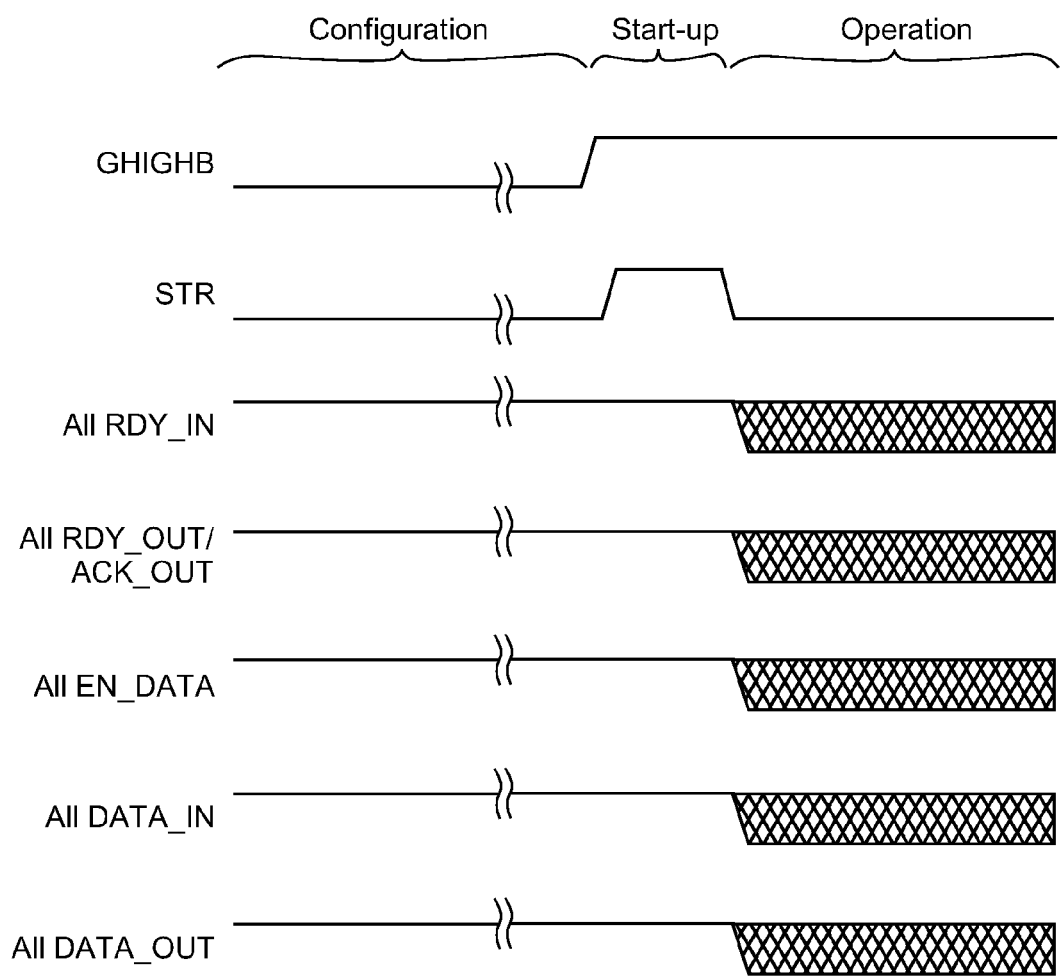
FIG. 21 is a waveform diagram illustrating how the methods of FIGS. 19 and 20 can be applied to the circuitry of FIG. 18.

FIG. 21 is a waveform diagram illustrating in more detail how the methods of FIGS. 19 and 20 can be applied to the circuitry of FIG. 18 when used in a programmable IC. FIG. 21 illustrates the signal values that would occur in the routing structure of FIG. 18 during configuration, start-up, and operation phases of the programmable IC.

The circuit of FIG. 18 has two input signals relating to the initialization process: GHIGHB and STR.

The GHIGHB (global-high-bar) signal is low during power-up and remains low during the configuration phase of a programmable IC, e.g., while configuration data is programmed into the programmable IC. Signal GHIGHB goes high after completion of the configuration phase, and remains high thereafter.

Strobe signal STR is initially low, and exhibits a high pulse after signal GHIGHB goes high. The high pulse may be initiated by a rising edge on signal GHIGHB, or by other means. The release of signal STR to a low value signals the end of the configuration sequence, and normal operation of the circuit implemented in the programmable IC begins.

During the configuration phase, nodes DATA_IN(1:N) are forced high by the GHIGHB signal turning on pullups 1852-1853. (See step 2005 in FIG. 20.) Similarly, all of the ready signals RDY_IN are forced high as the GHIGHB signal turns on pullups 1851. The low value on signal GHIGHB also forces the output of NAND gate 1872 high, which allows the high value on node RDY_IN to be passed through C-element 1740, driving signal ACK_OUT high. Thus, the acknowledge path is disabled, with all of the acknowledge signals in the acknowledge path signaling an acknowledgement of received data (see step 2010).

Because signal ACK_OUT is high, EN_DATAB goes low, enabling (opening) all of the latches 1780(1:N). The high values on nodes DATA_IN(1:N) are propagated to the DATA_OUT(1:N) outputs and throughout all of the data lines on the IC (action 2015).

For the duration of the configuration phase (step 2020), as the configuration data is programmed into the programmable IC, the C-element 1740 will pass only high values, because of the low value on signal GHIGHB. Therefore, the ACK_OUT signals remain high, and the EN_DATAB signals remain low. The data latches continue to pass data freely.

During the start-up phase, after configuration is complete and signal GHIGHB goes high, a strobe signal STR pulses high (e.g., triggered by the falling edge of signal GHIGHB). Strobe signal STR is included to accommodate the programmable nature of the IC. A design implemented in a programmable IC typically does not use all of the programmable resources of the IC. Once the design begins to operate, the used interconnect will assume values determined by the operation of the IC. However, the unused interconnect will not be driven once the design begins to operate, except by the data latches. Therefore, the high pulse on strobe signal STR performs the function of closing all the data latches, latching the predetermined value (e.g., the high value) into the data latches, and ensuring that all unused data lines continue to be driven to the predetermined value during operation of the design.

When the STR signal goes low again, the acknowledge path is enabled (step 2025, the ACK_IN signals are no longer pulled low), and the data lines are released to assume initial values determined by the programmed configuration values (action 2030). These values are then free to vary as determined by the normal operation of the design.

Those having skill in the relevant arts of the invention will now perceive various modifications and additions that can be made as a result of the disclosure herein. For example, pullups, pulldowns, transistors, P-channel transistors, N-channel transistors, N-channel pass gates, CMOS transmission gates, multiplexers, demultiplexers, logical AND gates, XOR gates, inverters, tristate inverters, C-elements, storage elements, latches, initialization circuitry, handshake circuits, routing structures, programmable switching structures, bus structures, memory cells, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. An integrated circuit (IC), comprising:
a plurality of substantially similar logic blocks each including a respective first storage element coupled to drive an output of the logic block; and
a plurality of programmable routing structures each including a respective second storage element coupled to unidirectionally drive an output of the programmable routing structure without traversing any pass gates,
wherein the output of each programmable routing structure is coupled to unidirectionally drive one of an input of another one of the programmable routing structures or an input of one of the logic blocks,
wherein the output of each logic block is coupled to drive an input of a corresponding programmable routing structure, and
wherein the logic blocks and the programmable routing structures are interconnected by unidirectional data lines organized as multi-bit busses coupled between multi-bit output and input ports of the logic blocks and the programmable routing structures.

2. The IC of claim 1, wherein the first and second storage elements comprise latches.

3. An integrated circuit (IC), comprising:
a plurality of substantially similar logic blocks each including a respective first storage element coupled to drive an output of the logic block; and
a plurality of programmable routing structures each including a respective second storage element coupled to unidirectionally drive an output of the programmable routing structure without traversing any pass gates,
wherein the output of each programmable routing structure is coupled to unidirectionally drive one of an input of another one of the programmable routing structures or an input of one of the logic blocks,
wherein the output of each logic block is coupled to drive an input of a corresponding programmable routing structure, and
wherein each programmable routing structure comprises a handshake circuit.

4. The IC of claim 3, wherein:

the logic blocks and the programmable routing structures are interconnected by unidirectional data lines organized as multi-bit busses coupled between multi-bit output and input ports of the logic blocks and of the programmable routing structures; and the handshake circuit in each programmable routing structure is coupled to control all bits in one of the multi-bit busses.

5. An integrated circuit (IC), comprising:

a plurality of substantially similar logic blocks each including a respective first storage element coupled to drive an output of the logic block; and a plurality of programmable routing structures each including a respective second storage element coupled to unidirectionally drive an output of the programmable routing structure without traversing any pass gates, wherein the output of each programmable routing structure is coupled to unidirectionally drive one of an input of another one of the programmable routing structures or an input of one of the logic blocks, and wherein the output of each logic block is coupled to drive an input of a corresponding programmable routing structure, wherein each programmable routing structure comprises:
a ready multiplexer;
an acknowledge demultiplexer; and
a C-element coupled to the ready multiplexer and the acknowledge demultiplexer, and further coupled to a control input of the respective second storage element.

6. The IC of claim 5, wherein each programmable routing structure further comprises:

a plurality of memory cells each coupled to select inputs of the ready multiplexer and the acknowledge demultiplexer.

7. The IC of claim 5, wherein each programmable routing structure further comprises:

a data multiplexer having an output coupled to a data input of the second storage element.

8. The IC of claim 7, wherein each programmable routing structure further comprises:

a plurality of memory cells each coupled to select inputs of the ready multiplexer, the acknowledge demultiplexer, and the data multiplexer.

9. The IC of claim 5, wherein each second storage element comprises a data multiplexer having a select input coupled to the control input of the second storage element.

10. The IC of claim 9, further comprising:

a logic gate coupled between an output of the C-element and the control input of the second storage element; and a memory cell coupled to select inputs of the ready multiplexer and the acknowledge demultiplexer, the memory cell being further coupled to an input of the logic gate.

11. An integrated circuit (IC), comprising:

a plurality of substantially similar logic blocks each including a plurality of first storage elements coupled to drive a plurality of outputs of the logic block; and a plurality of programmable routing structures having inputs and outputs, each programmable routing structure including a plurality of commonly controlled second storage elements coupled to unidirectionally drive corresponding outputs of the programmable routing structure without traversing any pass gates, wherein the outputs of each programmable routing structure are coupled to unidirectionally drive inputs of either another one of the programmable routing structures or one of the logic blocks, and wherein the outputs of each logic block are coupled to drive inputs of a corresponding programmable routing structure.

12. The IC of claim 11, wherein the first and second storage elements comprise latches.

13. The IC of claim 11, wherein each programmable routing structure comprises a single handshake circuit coupled to all of the second storage elements in the programmable routing structure.

14. The IC of claim 11, wherein each programmable routing structure comprises:

a ready multiplexer;
an acknowledge demultiplexer; and
a C-element coupled to select inputs of the ready multiplexer and the acknowledge demultiplexer, and further coupled to a control input of each of the second storage elements in the respective programmable routing structure.

15. The IC of claim 14, wherein each programmable routing structure further comprises:

a plurality of memory cells coupled to select inputs of the ready multiplexer and the acknowledge demultiplexer.

16. The IC of claim 14, wherein each programmable routing structure further comprises:

a plurality of data multiplexers, each data multiplexer being coupled to drive a corresponding one of the second storage elements.

17. The IC of claim 16, wherein each programmable routing structure further comprises:

a plurality of memory cells each coupled to select inputs of the ready multiplexer, the acknowledge demultiplexer, and each of the data multiplexers.

18. The IC of claim 14, wherein in each programmable routing structure, each second storage element comprises a data multiplexer having a select input coupled to the control input of the respective second storage element.

19. The IC of claim 18, wherein each programmable routing structure further comprises:

a plurality of logic gates, each logic gate being coupled between an output of the C-element and the control input of a corresponding second storage element; and a plurality of memory cells each coupled to select inputs of the ready multiplexer and the acknowledge demultiplexer, each memory cell being further coupled to an input of a corresponding one of the logic gates.

* * * * *